(12) United States Patent
Bai

(10) Patent No.: US 12,199,109 B2
(45) Date of Patent: Jan. 14, 2025

(54) THIN FILM TRANSISTOR ARRAY SUBSTRATE AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Sihang Bai, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 809 days.

(21) Appl. No.: 17/264,805

(22) PCT Filed: Nov. 24, 2020

(86) PCT No.: PCT/CN2020/130984
§ 371 (c)(1),
(2) Date: Jan. 30, 2021

(87) PCT Pub. No.: WO2022/011921
PCT Pub. Date: Jan. 20, 2022

(65) Prior Publication Data
US 2022/0399381 A1 Dec. 15, 2022

(30) Foreign Application Priority Data

Jul. 17, 2020 (CN) .......................... 202010693491.8

(51) Int. Cl.
*H01L 27/12* (2006.01)

(52) U.S. Cl.
CPC ...... *H01L 27/1248* (2013.01); *H01L 27/1251* (2013.01); *H01L 27/127* (2013.01); *H01L 27/1225* (2013.01)

(58) Field of Classification Search
None
See application file for complete search history.

(56) References Cited

U.S. PATENT DOCUMENTS 6,208,395 B1 * 3/2001 Kanoh .............. G02F 1/133553
349/41
9,985,082 B2 * 5/2018 Lee ...................... H10K 59/126
(Continued)

FOREIGN PATENT DOCUMENTS

CN 107591410 A 1/2018
CN 109300915 A 2/2019
(Continued)

OTHER PUBLICATIONS

International Search Report in International application No. PCT/CN2020/130984, mailed on Apr. 19, 2021.
(Continued)

*Primary Examiner* — Michelle Mandala
(74) *Attorney, Agent, or Firm* — PV IP PC; Wei Te Chung

(57) ABSTRACT

A thin film transistor array substrate and a display device are provided. The thin film transistor array substrate includes a first semiconductor layer, a second semiconductor layer, a first gate electrode, a conductive layer, a second gate electrode, a third gate electrode, and an intermediate insulating layer. The first semiconductor layer and the second semiconductor layer are made of different semiconductor materials. The first gate electrode and the conductive layer overlap with the first semiconductor layer. The second gate electrode and the third gate electrode overlap with the second semiconductor layer. The intermediate insulating
(Continued)

layer is disposed between the second semiconductor layer and the second gate electrode.

14 Claims, 1 Drawing Sheet

(56) References Cited

U.S. PATENT DOCUMENTS

| | | | |
|---|---|---|---|
| 10,088,728 B2* | 10/2018 | Yamaguchi | ........ G02F 1/136227 |
| 2011/0317104 A1* | 12/2011 | Nakamura | ............ G02F 1/1339 |
| | | | 257/E33.012 |
| 2017/0365649 A1 | 12/2017 | Kim | |
| 2018/0151654 A1 | 5/2018 | Lee | |
| 2020/0066765 A1* | 2/2020 | Cho | ................... H01L 27/1251 |
| 2020/0119117 A1* | 4/2020 | Kim | ................... H01L 27/1255 |
| 2020/0373375 A1* | 11/2020 | Na | ...................... H10K 59/122 |

FOREIGN PATENT DOCUMENTS

| | | |
|---|---|---|
| CN | 110858596 A | 3/2020 |
| CN | 111081723 A | 4/2020 |
| CN | 111785740 A | 10/2020 |
| CN | 213071138 U | 4/2021 |
| KR | 20180069974 A | 6/2018 |

OTHER PUBLICATIONS

Written Opinion of the International Search Authority in International application No. PCT/CN2020/130984, mailed on Apr. 21, 2021.
Chinese Office Action issued in corresponding Chinese Patent Application No. 202010693491.8 dated Oct. 26, 2024, pp. 1-10.
Chinese Journal of Luminescence pp. 208-212 Feb. 28, 2013 Fabrication of Transparent Indium Zinc Oxide Thin Film Transistors by Sol-gel Technology Enlong XIN, etc.

* cited by examiner

THIN FILM TRANSISTOR ARRAY SUBSTRATE AND DISPLAY DEVICE

RELATED APPLICATIONS

This application is a Notional Phase of PCT Patent Application No. PCT/CN2020/130984 having international filing date of Nov. 24, 2020, which claims the benefit of priority of Chinese Patent Application No. 202010693491.8 filed on Jul. 17, 2020. The contents of the above applications are all incorporated by reference as if fully set forth herein in their entirety.

FIELD OF DISCLOSURE

The present disclosure relates to the field of displays, in particular to a display device, and in particular to a thin film transistor array substrate of the display device.

BACKGROUND

With a development of display technologies and increasing requirements of users on an appearance and performance of display devices, an application of active-matrix organic light emitting diode (AMOLED) flexible displays is increasing. With an improvement of display performance, whether the display device can maintain characteristics of low power consumption has become a focus of attention.

Low-temperature polysilicon (LTPS) thin-film transistors are widely welcomed by markets for their high resolution, high brightness, and high aperture. However, a mobility of polysilicon in an active layer of the low temperature polysilicon (LTPS) is too large, resulting in higher leakage current and higher power consumption under low-frequency driving. In order to better expand gray scales, a length of a channel of a driving thin film transistor must be formed very large, so it is difficult to achieve a high PPI (pixels per inch). Moreover, a use of the low-temperature polysilicon as the active layer also has problems of high hysteresis and easily causing an image retention phenomenon. Metal oxide has emerged as a new semiconductor active layer material, and its advantages are higher carrier mobility, lower cost, low energy consumption, and low heat generation. However, its shortcomings are a poor stability of a TFT threshold voltage and the oxide active layer material being more sensitive to the outside world.

In the prior art, a thin film transistor array substrate and a display device have been formed by arranging semiconductor layers of different materials on the same substrate, such that the formed display device can have advantages of two thin film transistors. For example, the two semiconductor layers are made of a polysilicon material and a metal oxide material, so the formed display device can have advantages of high brightness and high resolution while reducing driving power consumption. However, a process is complicated. In particular, a manufacturing process temperature of low-temperature polysilicon components is about 600° C., which is difficult to combine with the metal oxide semiconductor technology, so a manufacturing cost remains high. Also, due to an existence of two different active layers, a thickness of an array substrate is large, and it is difficult to meet a current development trend of lightness, thinness, and flexibility.

SUMMARY OF DISCLOSURE

An object of the present disclosure is to provide a thin film transistor array substrate and a display device to optimize a production process, reduce a manufacturing cost, and have a better thickness of the array substrate.

In a first aspect, an embodiment of the present disclosure provides a thin film transistor array substrate, including: a first semiconductor layer, a first gate insulating layer, a first gate electrode, a second gate insulating layer, a conductive layer, a second gate electrode, an intermediate insulating layer, a second semiconductor layer, a third gate insulating layer, and a third gate electrode. The first gate insulating layer covers the first semiconductor layer. The first gate electrode is disposed on the first gate insulating layer and overlaps with the first semiconductor layer. The second gate insulating layer covers the first gate electrode. The conductive layer and the second gate electrode are disposed on the second gate insulating layer and are arranged in a same layer. The intermediate insulating layer covers the conductive layer and the second gate electrode. The second semiconductor layer is disposed on the intermediate insulating layer and overlaps with the second gate electrode. The third gate insulating layer covers the second semiconductor layer. The third gate electrode is disposed on the third gate insulating layer and overlaps with the second semiconductor layer.

The first semiconductor layer and the second semiconductor layer are made of different materials, and the intermediate insulating layer includes an oxide insulating layer.

In the thin film transistor array substrate, the first semiconductor layer includes a polysilicon semiconductor material, and the second semiconductor layer includes an oxide semiconductor material.

In the thin film transistor array substrate, the intermediate insulating layer is a single oxide insulating layer, and a thickness of the intermediate insulating layer ranges from 1500 Å to 4500 Å.

In the thin film transistor array substrate, a hydrogen content in the second gate insulating layer is greater than or equal to 20%.

In the thin film transistor array substrate, the intermediate insulating layer further includes a nitride insulating layer, the nitride insulating layer is disposed under the oxide insulating layer, and a film thickness of the oxide insulating layer is equal to or less than a film thickness of the nitride insulating layer.

In the thin film transistor array substrate, a hydrogen content in the nitride insulating layer is equal to or greater than 10% and is equal to or less than 15%, and a hydrogen content in the second gate insulating layer is greater than 15%.

In the thin film transistor array substrate, the oxide insulating layer is a dense oxide film layer.

In the thin film transistor array substrate, a deposition/etching ratio of the oxide insulating layer is greater than 3:1.

In the thin film transistor array substrate, a thickness of the intermediate insulating layer is 2 to 3 times a thickness of the second gate insulating layer.

In the thin film transistor array substrate, a height difference between an upper surface of the first semiconductor layer and a lower surface of the second semiconductor layer ranges from 3500 Å to 7500 Å.

In a second aspect, an embodiment of the present disclosure provides a display device, including a thin film transistor array substrate. The thin film transistor array substrate includes:

a first semiconductor layer, a first gate insulating layer, a first gate electrode, a second gate insulating layer, a conductive layer, a second gate electrode, an intermediate insulating layer, a second semiconductor layer, a third gate insulating layer, and a third gate electrode. The first gate insulating layer covers the first semiconductor layer. The first gate electrode is disposed on the first gate insulating layer and overlaps with the first semiconductor layer. The second gate insulating layer covers the first gate electrode. The conductive layer and the second gate electrode are disposed on the second gate insulating layer and are arranged in a same layer. The intermediate insulating layer covers the conductive layer and the second gate electrode. The second semiconductor layer is disposed on the intermediate insulating layer and overlaps with the second gate electrode. The third gate insulating layer covers the second semiconductor layer. The third gate electrode is disposed on the third gate insulating layer and overlaps with the second semiconductor layer. The first semiconductor layer and the second semiconductor layer are made of different materials, and the intermediate insulating layer includes an oxide insulating layer.

In the display device, the first semiconductor layer includes a polysilicon semiconductor material, and the second semiconductor layer includes an oxide semiconductor material.

In the display device, the intermediate insulating layer is a single oxide insulating layer, and a thickness of the intermediate insulating layer ranges from 1500 Å to 4500 Å.

In the display device, a hydrogen content in the second gate insulating layer is greater than or equal to 20%.

In the display device, the intermediate insulating layer further includes a nitride insulating layer, the nitride insulating layer is disposed under the oxide insulating layer, and a film thickness of the oxide insulating layer is equal to or less than a film thickness of the nitride insulating layer.

In the display device, a hydrogen content in the nitride insulating layer is equal to or greater than 10% and is equal to or less than 15%, and a hydrogen content in the second gate insulating layer is greater than 15%.

In the display device, the oxide insulating layer is a dense oxide film layer.

In the display device, a deposition/etching ratio of the oxide insulating layer is greater than 3:1.

In the display device, a thickness of the intermediate insulating layer is 2 to 3 times a thickness of the second gate insulating layer.

In the display device, a height difference between an upper surface of the first semiconductor layer and a lower surface of the second semiconductor layer ranges from 3500 Å to 7500 Å.

In comparison with the prior art, in the present disclosure, a low-temperature polysilicon semiconductor is subjected to a hydrogenation process in advance to avoid a high-temperature processing from affecting a metal oxide semiconductor material. Also, a film structure and a molding process of the thin film transistor array substrate are optimized, a process time is shortened, a manufacturing cost is saved, a film thickness is reduced, and a flexible bending performance of the array substrate is improved.

DETAILED DESCRIPTION

The present disclosure provides a thin film transistor array substrate and a display device. In order to make purposes, technical solutions, and effects of the present disclosure clearer and specific, the present disclosure will be further described in detail below with reference to the accompanying drawings and embodiments. It should be understood that the specific embodiments described here are only used to explain the present disclosure, and are not used to limit the present disclosure.

Figure 1:
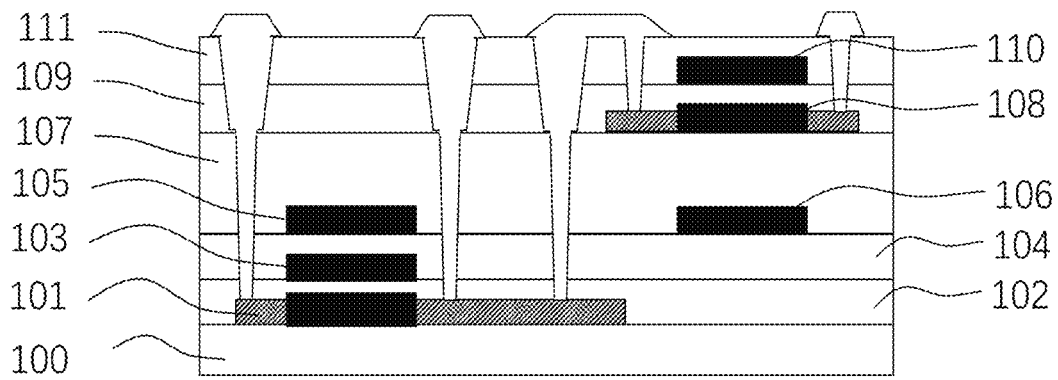
FIG. 1 is a schematic diagram of a thin film transistor array substrate of an embodiment of the present disclosure.

Please refer to FIG. 1, which is a schematic diagram of a thin film transistor array substrate of a first embodiment of the present disclosure. The present disclosure provides a thin film transistor array substrate. The thin film transistor array substrate includes a base substrate 100, a first semiconductor layer 101, a first gate insulating layer 102, a first gate electrode 103, a second gate insulating layer 104, a conductive layer 105, a second gate electrode 106, an intermediate insulating layer 107, a second semiconductor layer 108, a third gate insulating layer 109, and a third gate electrode 110. The first semiconductor layer 101 is disposed on the base substrate 100. The first gate insulating layer 102 covers the first semiconductor layer 101. The first gate electrode 103 is disposed on the first gate insulating layer 102 and overlaps with the first semiconductor layer 101. The second gate insulating layer 104 covers the first gate electrode 103. The conductive layer 105 and the second gate electrode 106 are disposed on the second gate insulating layer 104 and are arranged in a same layer. The intermediate insulating layer 107 covers the conductive layer 105 and the second gate electrode 106. The second semiconductor layer 108 is disposed on the intermediate insulating layer 107 and overlaps with the second gate electrode 106. The third gate insulating layer 109 covers the second semiconductor layer 108. The third gate electrode 110 is disposed on the third gate insulating layer 109 and overlaps with the second semiconductor layer 108. The conductive layer 105 overlaps with the first gate electrode 103. The conductive layer 105 and the first gate electrode 103 below the conductive layer 105 together form upper and lower electrodes of a storage capacitor in a pixel circuit. The second gate electrode 106 serves as a lower gate of an oxide thin film transistor. The second gate electrode 106 and the first gate electrode 103 do not overlap.

The first semiconductor layer 101 and the second semiconductor layer 108 are made of different materials. In this embodiment, it is preferable that the first semiconductor layer 101 includes a polysilicon semiconductor material, such as low temperature polysilicon (LTPS). The second semiconductor layer 108 includes an oxide semiconductor material, such as indium gallium zinc oxide (IGZO). In other embodiments, the metal oxide semiconductor layer may also include at least one of zinc oxide (ZnO), indium oxide (InO), and gallium oxide (GaO). The first semiconductor layer and the second semiconductor layer form active layers of a first thin film transistor and a second thin film transistor, respectively. The thin film transistor array substrate further includes a fourth gate insulating layer 111 disposed on the third gate electrode 110, a first source/drain, and a second source/drain. The first source/drain and the second source/drain are disposed on the fourth gate insulating layer 111. The first source/drain is connected to the first semiconductor layer. The second source/drain is connected to the second semiconductor layer.

Due to there is a grain boundary state between polysilicon crystal grains and there is an interface state between the polysilicon and the gate insulating layer, these affect electrical properties of the polysilicon thin film transistor. Therefore, in a manufacturing process of low-temperature polysilicon thin film transistors, the polysilicon active layer is often subjected to a hydrogenation treatment. The hydrogenation treatment is to use hydrogen ions to fill unbound bonds of polysilicon atoms to reduce dangling bonds, thereby improving a stability of P-Si, improving electron mobility, electrical conductivity, and threshold voltage uniformity, and reducing leakage current (Ioff). However, the hydrogenation treatment needs to be carried out under high temperature conditions, which will cause hydrogen ions (H+) to diffuse in all directions, and will cause free H+ to snatch oxygen from the metal oxide when it acts on the active layer of the oxide thin film transistor. Thus, a large number of oxygen defects appear in the oxide, which makes the oxide semiconductor layer conductive, which in turn causes a short circuit of a source and a drain of the oxide transistor.

In the prior art, in order to save processes, the hydrogenation treatment of the polysilicon and a heat treatment of the oxide semiconductor layer are often performed simultaneously. In order to avoid an influence of hydrogen ions on the oxide semiconductor material during a high-temperature hydrogenation process, the intermediate insulating layer disposed between the two semiconductor layers needs to have a good hydrogen barrier capability. Hence, the intermediate insulating layer needs to have a sufficient thickness to achieve the above purposes, which results in a large thickness of the formed array substrate, and cannot meet a requirement of flexible bending.

In the embodiment of the present disclosure, the high-temperature hydrogenation treatment of the polysilicon in the thin film transistor array substrate is performed in advance. That is, after the second gate insulating layer 104 is formed, the first semiconductor layer 101 is subjected to the high-temperature hydrogenation treatment. At this time, hydrogen ions can only migrate in a direction of the polysilicon semiconductor material below. After the hydrogenation treatment is completed, the conductive layer 104, the second gate electrode 106, and the intermediate insulating layer 107 are subsequently formed. Since the hydrogenation treatment has been completed, there is no need for the hydrogen ions to be supplemented and provided by the intermediate insulating layer for performing the hydrogenation treatment. Thus, the intermediate insulating layer 107 may be a single oxide insulating layer, which can reduce the forming process of the film layer, simplify the process, and reduce the manufacturing cost. Moreover, since the intermediate insulating layer 107 does not need to be subjected to the high-temperature hydrogenation process, a requirement for its hydrogen barrier ability will be reduced, so that a thickness of the single oxide insulating layer has room for further optimization, which is more conducive to achieving flexible bending. Specifically, the thickness of the intermediate insulating layer preferably ranges from 1500 Å to 4500 Å. This thickness range can not only ensure a good hydrogen barrier performance to prevent the oxide semiconductor layer from being conductive, but also ensure the flexible bending performance of the thin film transistor array substrate.

The intermediate insulating layer 107 is preferably an inorganic insulating layer made of SiOx material, and its manufacturing method includes a chemical vapor deposition (CVD) manufacturing process, a physical vapor deposition (PVD) manufacturing process, and a spin coating method, etc.

In order to ensure sufficient hydrogenation, a hydrogen content of the first gate insulating layer 102 and the second gate insulating layer 104 can be adjusted to provide sufficient hydrogen ions to the first semiconductor layer 101 during the hydrogenation process. The hydrogen content in the film can be adjusted by adjusting process parameters, such as adjusting a film formation rate and gas ratio. After the film is formed, an H+concentration in each film layer can be measured by a method of measuring contents of S-H and N-H in the film by a spectroscopic analysis, such as fourier-transform infrared spectroscopy (FTIR). In this embodiment, it is preferable that the hydrogen content in the second gate insulating layer 104 is greater than or equal to 20%, and it is more preferable that the hydrogen content in the second gate insulating layer 104 ranges from 20% to 30% to ensure that sufficient hydrogen ions are provided during the hydrogenation process to realize a complete hydrogenation of the polysilicon.

In other embodiments, the hydrogenation treatment process may also be performed after a metal layer where the conductive layer 105 and the second gate electrode 106 are formed. At this time, the metal layer has not been etched yet, and can completely cover the second gate insulating layer 104. During the hydrogenation treatment, the metal layer can also block an upward migration of hydrogen ions, thereby improving a utilization rate of hydrogen ions and the hydrogenation performance. After the hydrogenation treatment is completed, the metal layer is patterned to form the conductive layer 105 and the second gate electrode 106. The conductive layer 105 and the second gate electrode 106 of the second thin film transistor are arranged in the same layer, which simplifies the process, reduces one film layer formation process, and facilitates a reduction of an overall thickness of the array substrate. Similarly, since the subsequently formed intermediate insulating layer does not be subjected to the hydrogenation treatment, it is beneficial to further optimize and reduce the thickness of the intermediate insulating layer 107.

Figure 2:
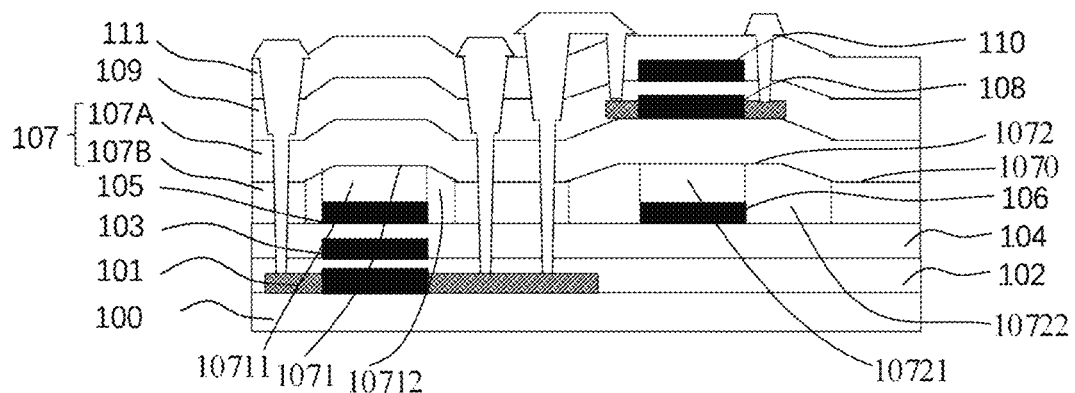
FIG. 2 is a schematic diagram of a thin film transistor array substrate of another embodiment of the present disclosure.

In other embodiments, in order to shorten a heat treatment time, a process of performing the hydrogenation treatment and the heat treatment of the oxide semiconductor at the same time can also be used. At this time, in order to optimize the thickness of the film layer, the intermediate insulating layer needs to be improved. As shown in FIG. 2, the intermediate insulating layer 107 includes an oxide insulating layer 107A and a nitride insulating layer 107B. The nitride insulating layer 107B is disposed under the oxide insulating layer 107A. Continuously with reference to FIG. 2, the nitride insulating layer 107B and the oxide insulating layer 107A are each of a concave-convex structure. The nitride insulating layer 107B includes a flat portion 1070, a first protruding portion 1071 covering the conductive layer 105 and protruding from the flat portion 1070, and a second protruding portion 1072 covering the second gate electrode 106 and protruding from the flat portion 1070. The first protruding portion 1071 includes a first region 10711 directly above the conductive layer 105 and a first side region 10712 on sides of the conductive layer 105; and the second protruding portion 1072 includes a second region 10721 directly above the second gate electrode 106 and a second side region 10722 on sides of the second gate electrode 106. Thicknesses of the first side region 10712 and the second side region 10722 are greater than a thickness of the flat portion 1070, a thickness of the first region 10711, and a thickness of the second region 10721; and the thickness of the first region 10711 and the thickness of the second region 10721 are equal to the thickness of the flat portion 1070.

In the hydrogenation process of the polysilicon semiconductor layer, there are two main factors that affect the migration of hydrogen ions. First, whether there is a substance that blocks hydrogen diffusion to affect a normal diffusion of H. Second, the diffusion of hydrogen ions will diffuse from high concentration to low concentration. In this embodiment, the nitride insulating layer 107B in the intermediate insulating layer 107 is attached to the second gate insulating layer 104, where the nitrogen element can inhibit the migration of hydrogen ions, and prevent the hydrogen ions from diffusing toward the oxide semiconductor, thereby improving the utilization of hydrogen ions. Moreover, the nitride insulating layer 107B also contains hydrogen, which can also play a role in supplementing hydrogen ions during the hydrogenation process to ensure the complete hydrogenation of the polysilicon. Since the oxide insulating layer 107A in the intermediate insulating layer 107 does not contain hydrogen ions, it can effectively block the migration of hydrogen ions, and can effectively avoid the influence of hydrogen ions on the oxide semiconductor material. Thus, a process combination of polysilicon thin film transistors and oxide semiconductor thin film transistors is realized, which improves a yield of products.

In order to control the migration direction of hydrogen ions, in this embodiment, it is further limited that a hydrogen ion content in the nitride insulating layer 107B is only slightly less than a hydrogen ion content in the second gate insulating layer 104, such that a concentration difference of hydrogen contents between the nitride insulating layer 107B and the adjacent second gate insulating layer 104 is much less than a concentration difference between hydrogen contents of the second gate insulating layer 104 and the first semiconductor layer 101. Therefore, when the hydrogen ions diffuse, they will migrate toward the first semiconductor layer 101 with a large concentration difference. This is equivalent to forming a migration barrier switch in the nitride insulating layer, which can achieve a better migration suppression effect. In this embodiment, it is preferable that the hydrogen content in the nitride insulating layer 107B is ≥10% and ≤15%. The hydrogen content in the second gate insulating layer 104 is greater than 15%. In this way, it is possible to ensure a sufficient supply of hydrogen ions to achieve complete hydrogenation of the polysilicon, and to achieve a better effect of inhibiting the migration of hydrogen ions to the second semiconductor layer 108.

Furthermore, the hydrogen barrier performance can also be improved by increasing a film density. In other embodiments, the oxide insulating layer 107A is a dense oxide film layer. Specifically, the oxide insulating layer 107A is preferably made of SiOx. By adjusting a deposition rate of the oxide insulating layer, and using a coupling agent modification or heat treatment of the film layer at 200° C.-500° C., a denser oxide insulating layer with higher density can be obtained.

The deposition and etching ratio of the oxide film is usually used to characterize the density of the oxide film. The higher the deposition etching ratio means the higher the film density. In this embodiment, it is preferable to deposit the oxide film layer with an etching ratio higher than 3:1 as the dense oxide film layer, so that it has better hydrogen barrier performance.

By improving the hydrogen barrier ability of the nitride insulating layer 107B or the oxide insulating layer 107A in the intermediate insulating layer 107, the intermediate insulating layer 107 (especially, the oxide insulating layer 107A) avoids using a larger thickness to obtain a better hydrogen barrier performance. Furthermore, reducing the thickness of the oxide insulating layer 107A becomes a feasible and beneficial direction for improvement. In this embodiment, it is preferable that the film thickness of the oxide insulating layer 107A is less than or equal to the film thickness of the nitride insulating layer 107B. This can shorten the time for film deposition or coating, improve mass production efficiency, and be beneficial to reduce the thickness of the thin film transistor array substrate.

In some embodiments, the thickness of the first gate insulating layer 102 and the thickness of the second gate insulating layer 104 both range from 1000 Å to 1500 Å. The thickness of the intermediate insulating layer 107 is 2-3 times the thickness of the second gate insulating layer 104. Furthermore, it is preferable that the thickness of the intermediate insulating layer 107 ranges from 1500 Å to 4500 Å. On the other hand, by optimizing the film structure and manufacturing process of the array substrate, a height difference between an upper surface of the first semiconductor layer and a lower surface of the second semiconductor layer in the thin film transistor array substrate preferably ranges from 3500 Å to 7500 Å. Preferably, the height difference between the upper surface of the first semiconductor layer and the lower surface of the second semiconductor layer ranges from 4500 Å to 6500 Å. In this way, both functional characteristics and flexibility of the thin film transistor array substrate are taken into consideration, and the manufacturing process is also conducive to reducing costs and improving production efficiency.

An embodiment of the present disclosure also provides a display device, and the display device includes the thin film transistor array substrate described above.

It is understandable that for those of ordinary skill in the art, equivalent replacements or changes can be made according to the technical solutions of the present application and its inventive concept, and all these changes or replacements shall fall within the protection scope of the appended claims of the present application.

What is claimed is:
1. A thin film transistor array substrate, comprising:
a first semiconductor layer;
a first gate insulating layer covering the first semiconductor layer;
a first gate electrode disposed on the first gate insulating layer and overlapping with the first semiconductor layer;
a second gate insulating layer covering the first gate electrode;
a conductive layer and a second gate electrode disposed on the second gate insulating layer and arranged in a same layer;
an intermediate insulating layer covering the conductive layer and the second gate electrode;
a second semiconductor layer disposed on the intermediate insulating layer and overlapping with the second gate electrode;
a third gate insulating layer covering the second semiconductor layer; and
a third gate electrode disposed on the third gate insulating layer and overlapping with the second semiconductor layer,
wherein the first semiconductor layer and the second semiconductor layer are made of different materials, and the intermediate insulating layer comprises an oxide insulating layer, the first semiconductor layer comprises a polysilicon semiconductor material, and the second semiconductor layer comprises an oxide semiconductor material, wherein the intermediate insulating layer further comprises a nitride insulating layer, the nitride insulating layer is disposed under the oxide insulating layer, and a film thickness of the oxide insulating layer is equal to or less than a film thickness of the nitride insulating layer;

wherein the nitride insulating layer and the oxide insulating layer are each of a concave-convex structure, and the nitride insulating layer comprises a flat portion, a first protruding portion covering the conductive layer and protruding from the flat portion, and a second protruding portion covering the second gate electrode and protruding from the flat portion; wherein the first protruding portion comprises a first region directly above the conductive layer and a first side region on sides of the conductive layer; and the second protruding portion comprises a second region directly above the second gate electrode and a second side region on sides of the second gate electrode;

wherein thicknesses of the first side region and the second side region are greater than a thickness of the flat portion, a thickness of the first region, and a thickness of the second region; and the thickness of the first region and the thickness of the second region are equal to the thickness of the flat portion.

2. The thin film transistor array substrate as claimed in claim 1, wherein a hydrogen content in the second gate insulating layer is greater than or equal to 20%.

3. The thin film transistor array substrate as claimed in claim 1, wherein a hydrogen content in the nitride insulating layer is equal to or greater than 10% and is equal to or less than 15%, and a hydrogen content in the second gate insulating layer is greater than 15%.

4. The thin film transistor array substrate as claimed in claim 1, wherein the oxide insulating layer is a dense oxide film layer.

5. The thin film transistor array substrate as claimed in claim 1, wherein a deposition/etching ratio of the oxide insulating layer is greater than 3:1.

6. The thin film transistor array substrate as claimed in claim 1, wherein a thickness of the intermediate insulating layer is 2 to 3 times a thickness of the second gate insulating layer.

7. The thin film transistor array substrate as claimed in claim 1, wherein a height difference between an upper surface of the first semiconductor layer and a lower surface of the second semiconductor layer ranges from 3500 Å to 7500 Å.

8. A display device, comprising a thin film transistor array substrate, wherein the thin film transistor array substrate comprises:
a first semiconductor layer;
a first gate insulating layer covering the first semiconductor layer;
a first gate electrode disposed on the first gate insulating layer and overlapping with the first semiconductor layer;
a second gate insulating layer covering the first gate electrode;
a conductive layer and a second gate electrode disposed on the second gate insulating layer and arranged in a same layer;
an intermediate insulating layer covering the conductive layer and the second gate electrode;
a second semiconductor layer disposed on the intermediate insulating layer and overlapping with the second gate electrode;
a third gate insulating layer covering the second semiconductor layer; and
a third gate electrode disposed on the third gate insulating layer and overlapping with the second semiconductor layer, wherein the first semiconductor layer and the second semiconductor layer are made of different materials, and the intermediate insulating layer comprises an oxide insulating layer, the first semiconductor layer comprises a polysilicon semiconductor material, and the second semiconductor layer comprises an oxide semiconductor material, wherein the intermediate insulating layer further comprises a nitride insulating layer, the nitride insulating layer is disposed under the oxide insulating layer, and a film thickness of the oxide insulating layer is equal to or less than a film thickness of the nitride insulating layer;

wherein the nitride insulating layer and the oxide insulating layer are each of a concave-convex structure, and the nitride insulating layer comprises a flat portion, a first protruding portion covering the conductive layer and protruding from the flat portion, and a second protruding portion covering the second gate electrode and protruding from the flat portion; wherein the first protruding portion comprises a first region directly above the conductive layer and a first side region on sides of the conductive layer; and the second protruding portion comprises a second region directly above the second gate electrode and a second side region on sides of the second gate electrode;

wherein thicknesses of the first side region and the second side region are greater than a thickness of the flat portion, a thickness of the first region, and a thickness of the second region; and the thickness of the first region and the thickness of the second region are equal to the thickness of the flat portion.

9. The display device as claimed in claim 8, wherein a hydrogen content in the second gate insulating layer is greater than or equal to 20%.

10. The display device as claimed in claim 8, wherein a hydrogen content in the nitride insulating layer is equal to or greater than 10% and is equal to or less than 15%, and a hydrogen content in the second gate insulating layer is greater than 15%.

11. The display device as claimed in claim 8, wherein the oxide insulating layer is a dense oxide film layer.

12. The display device as claimed in claim 11, wherein a deposition/etching ratio of the oxide insulating layer is greater than 3:1.

13. The display device as claimed in claim 8, wherein a thickness of the intermediate insulating layer is 2 to 3 times a thickness of the second gate insulating layer.

14. The display device as claimed in claim 8, wherein a height difference between an upper surface of the first semiconductor layer and a lower surface of the second semiconductor layer ranges from 3500 Å to 7500 Å.

* * * * *